(12) United States Patent
Goto et al.

(10) Patent No.: US 7,586,564 B2
(45) Date of Patent: Sep. 8, 2009

(54) LIGHT-SENSITIVE COMPOSITION, LIGHT-SENSITIVE TRANSFER MATERIAL, LIGHT SHIELDING LAYER FOR DISPLAY DEVICE, COLOR FILTER, LIQUID CRYSTAL DISPLAY ELEMENT, AND SUBSTRATE HAVING LIGHT SHIELDING LAYER FOR DISPLAY DEVICE AND PRODUCING METHOD THEREOF

(75) Inventors: Hidenori Goto, Shizuoka-ken (JP); Akira Hatakeyama, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 423 days.

(21) Appl. No.: 11/090,833

(22) Filed: Mar. 28, 2005

(65) Prior Publication Data
US 2005/0212997 A1  Sep. 29, 2005

(30) Foreign Application Priority Data
Mar. 26, 2004  (JP)  ............................. 2004-093598

(51) Int. Cl.
*G02F 1/1333* (2006.01)
(52) U.S. Cl. .................................................... 349/110
(58) Field of Classification Search ................ 349/110, 349/106, 111
See application file for complete search history.

(56) References Cited

U.S. PATENT DOCUMENTS

| 3,873,317 | A | * | 3/1975 | Kato et al. | ................... 430/232 |
| 3,925,075 | A | * | 12/1975 | Wingender et al. | ......... 430/239 |
| 4,689,287 | A | * | 8/1987 | Katoh et al. | ................ 430/230 |
| 5,667,921 | A | * | 9/1997 | Takayanagi et al. | ............ 430/7 |
| 7,045,257 | B2 | * | 5/2006 | Hatakeyama et al. | .......... 430/7 |

FOREIGN PATENT DOCUMENTS

JP  62-9301 A  1/1987

OTHER PUBLICATIONS

"Color TFT Liquid Crystal Display", Semiconductor Equipment and Materials International, Jul. 20, 1996, pp. 218-220.

* cited by examiner

*Primary Examiner*—Thoi V Duong
(74) *Attorney, Agent, or Firm*—Sughrue Mion, PLLC

(57) ABSTRACT

The invention provides a light-sensitive composition including a silver deposition nucleus. By using the light-sensitive composition, a light shielding layer for a display device can be obtained. Further, the invention provides a color filter, a liquid crystal display element, a substrate having a light shielding layer for a display device, and a producing method for the substrate having a light shielding layer for a display device.

13 Claims, No Drawings

LIGHT-SENSITIVE COMPOSITION, LIGHT-SENSITIVE TRANSFER MATERIAL, LIGHT SHIELDING LAYER FOR DISPLAY DEVICE, COLOR FILTER, LIQUID CRYSTAL DISPLAY ELEMENT, AND SUBSTRATE HAVING LIGHT SHIELDING LAYER FOR DISPLAY DEVICE AND PRODUCING METHOD THEREOF

CROSS-REFERENCE TO RELATED APPLICATION

This application claims priority under 35 USC 119 from Japanese Patent Application No. 2004-093598, the disclosure of which is incorporated by reference herein.

BACKGROUND OF THE INVENTION

1. Field of the Invention

The present invention relates to a light-sensitive composition, a light-sensitive transfer material, a light shielding layer for a display device prepared by using the light-sensitive composition or the light-sensitive transfer material, a color filter provided with the light shielding layer for a display device, a liquid crystal display element, a substrate having the light shielding layer for a display device, and a producing method for the substrate having the light shielding layer for a display device.

2. Description of the Related Art

A color filter to be used in a color liquid crystal display and the like has a color pixel layer (R, G, B) formed on a transparent substrate, and a light shielding layer for a display device formed in gaps between the color pixels of R, G, B (red, green, blue) for improvement of display contrast, etc. In particular, a liquid crystal display element of an active matrix driving system that uses a thin film transistor (TFT) requires high light shielding properties in the light shielding layer for a display device in order also to prevent a deterioration in image quality due to current leakage in the thin film transistors caused by light.

There has been known a method of forming a light shielding layer for a display device in which, for example, a metal film such as chromium is used as a light shielding layer, producing a metallic thin film by an evaporation method or a sputtering method, coating a photoresist on the metallic thin film, subjecting the photoresist layer to exposure and development by means of a photomask having a pattern for a light shielding layer for a display device, etching the exposed metallic thin film, and subsequently releasing the photoresist layer on the metallic thin film (e.g., see "Karah TFT Ekisho Display (Color TFT Liquid Crystal Displays)" published by Kyoritsu Shuppan Co., Ltd., pp. 218-220 (Jul. 20, 1996)).

In this method, although the resulting light shielding layer for the display device can provide high light shielding effect even with small film thickness due to use of a metallic thin film, the method requires a vacuum film forming step and an etching step of using a liquid represented by the evaporation method and the sputtering method during production. This leads to higher cost, and problems such as environmental impact cannot be neglected. Also, since the light shielding layer is a metal film, reflectance is high, which causes a problem of the display contrast being low under strong external light. While there is a means of using a low reflectance, chromium film (two layers comprising metal chromium and chromium oxide, and the like), this inevitably leads to further increased costs.

Another known method of forming a light shielding layer for a display device employs a light-sensitive resin composition containing a light shielding pigment, including carbon black. More specifically, a method of forming a light shielding layer for a display device of the self alignment mode is also known, which involves, for example, forming R, G and B pixels on a transparent substrate, coating on the pixels a light-sensitive resin composition containing carbon black and subsequently exposing light to the entire surface from the surface side on which the R, G and B pixels of the transparent substrate are not formed (refer to Japanese Patent Application Laid-Open (JP-A) No. 62-9301).

Although this method allows the production cost to be lower than that of the method that etches the above-mentioned metal film, the former causes a problem in that the wall becomes too thick in an attempt to obtain sufficient light shielding properties. As a result, overlaps (bumps) occur between the light shielding layer for a display device and R, G and B pixels, whereby the evenness of the color filter deteriorates to generate cell gap irregularity of the liquid crystal display element, leading to concern about display failure such as color irregularity.

SUMMARY OF THE INVENTION

The present invention addresses the above situations and provides a light-sensitive composition and a light-sensitive transfer material capable of producing a light shielding layer for a display device which is thin, high in light shielding performance, and is produced at low cost. Also, the invention provides a light shielding layer for a display device which is thin, high in light shielding performance, and capable of being produced at low cost, and a method of producing the light shielding layer.

The invention further provides a color filter and liquid crystal display element, both having the light shielding layer for a display device of the invention, which is thin and high in light shielding performance, and also provides a substrate having a light shielding layer for a display device which is thin and high in light shielding performance, and a producing method thereof.

A first aspect of the invention is to provide a light-sensitive composition comprising a silver deposition nucleus.

A second aspect of the invention is to provide a light-sensitive composition comprising a silver deposition nucleus, a photopolymerization initiator, a photopolymerizable monomer, and a binder.

A third aspect of the invention is to provide a light-sensitive transfer material comprising a support provided with at least a light-sensitive silver deposition nucleus layer, wherein the light-sensitive silver deposition nucleus layer comprises a silver deposition nucleus, a photopolymerization initiator, a photopolymerizable monomer, and a binder.

A fourth aspect of the invention is to provide a light shielding layer for a display device, wherein a light-sensitive silver deposition nucleus layer formed on a substrate by means of the light-sensitive composition of the first or the second aspect or by means of the light-sensitive transfer material of the third aspect is subjected to exposure and developing treatment, followed by silver deposition.

A fifth aspect of the invention is to provide a light shielding layer for a display device, wherein a light-sensitive silver deposition nucleus layer formed on a substrate by means of the light-sensitive composition of the first or the second aspect or by means of the light sensitive transfer material of the third aspect is subjected to silver deposition, followed by exposure and developing treatment.

A sixth aspect of the invention is to provide a color filter comprising a colored layer on a light transmitting substrate and comprising two or more pixel groups that exhibit colors different from each other, wherein each pixel constituting the pixel groups is separated from each other by a light shielding layer for a display device, and wherein the light shielding layer for a display device is the light shielding layer for a display device of the fourth of the fifth aspect.

A seventh aspect of the invention is to provide a liquid crystal display element comprising a color filter, a liquid crystal layer and a liquid crystal driver between a pair of substrates, at least one of the substrates having light transmitting properties, wherein the color filter is the color filter of the sixth aspect.

An eighth aspect of the invention is to provide a liquid crystal display element comprising a color filter, a liquid crystal layer and a liquid crystal driver between a pair of substrates, at least one of the substrates having light transmitting properties, wherein the liquid crystal driver has active elements, and wherein the light shielding layer for a display device of the fourth or the fifth aspect is formed between the active elements.

A ninth aspect of the invention is to provide a substrate having a light shielding layer for a display device comprising a light shielding layer on a light transmitting substrate, wherein the light shielding layer is the light shielding layer for a display device of the fourth or the fifth aspect.

A tenth aspect of the invention is to provide a method of producing a substrate having a light shielding layer for a display device, comprising: forming on a light transmitting substrate a light-sensitive silver deposition nucleus layer comprising a silver deposition nucleus, a photopolymerization initiator, a photopolymerizable monomer, and a binder; subjecting the light-sensitive silver deposition nucleus layer to imagewise exposure to photopolymerize a light exposed portion; removing a non-exposed portion with a developer to form a silver deposition nucleus pattern; and applying to the silver deposition nucleus pattern a silver complex treating solution comprising a silver halide solvent to deposit the silver on the silver deposition nucleus, thereby forming a light shielding layer.

An eleventh aspect of the invention is to provide a method of producing a substrate having a light shielding layer for a display device, comprising: forming on a light transmitting substrate a light-sensitive silver deposition nucleus layer comprising a silver deposition nucleus, a photopolymerization initiator, a photopolymerizable monomer, and a binder; applying to a silver deposition nucleus pattern a silver complex treating solution comprising a silver halide solvent to deposit the silver on the silver deposition nucleus, thereby forming a light-sensitive silver deposition layer; subjecting the light-sensitive silver deposition layer to imagewise exposure to photopolymerize a light exposed portion; and removing a non-exposed portion with a developer to form a silver deposition pattern.

DETAILED DESCRIPTION OF THE INVENTION

Hereinafter, the present invention will be explained in detail.

Light-Sensitive Composition for Producing of Light Shielding Layer for Display Device At first, a light-sensitive composition of the invention will be explained. A light-sensitive composition of the invention includes at least one type of silver deposition nucleus. A light-sensitive composition of the second aspect of the invention further includes a photopolymerization initiator, a photopolymerizable monomer, and a binder. Any of these light-sensitive compositions can be suitably used as a light-sensitive silver deposition layer or a image receiving layer for producing a light shielding layer for a display device. Components of these light-sensitive compositions will be described one by one.

Silver Deposition Nucleus

A silver deposition nucleus that can be used in the invention may be obtained in accordance with a process of preparing a silver halide emulsion that is well known in the photography industry. In principle, a nucleus comprising a sulfide can be prepared by the reaction of a sulfide ion solution and a metal ion solution or the reaction of each single solution; the resulting nucleus may be applied to the invention.

A silver deposition nucleus is a compound that assists the function of a developing agent that forms silver fine particles by reducing a transferring silver complex salt diffused from a silver halide emulsion layer. Specific examples of the silver deposition nucleus may include heavy metals such as iron, lead, zinc, nickel, tin, copper, chromium, and cobalt, and noble metals such as gold, silver (including colloidal silver), platinum, and palladium. Preferable examples of the silver deposition nucleus also include sulfides of noble metals and selenides of noble metals, for example, sulfides of mercury, copper, zinc, silver, palladium, etc., and selenides of lead, zinc, antimony, etc. Of these, more preferable examples include gold, platinum, palladium and sulfides thereof.

Preferable examples of compounds that can become sulfide ions for the formation of the silver deposition nucleus include water-soluble sulfides such as sodium sulfide and potassium sulfide, and may also include ion-containing compounds which are soluble in organic solvents such as acetone, diacetone alcohol or methanol, or in mixed solvents of these organic solvents and water, and also which can form sulfides with metal ions.

Preferable examples of compounds that can become palladium ions include water-soluble palladium compounds such as a sodium salt of chloropalladate and a potassium salt of chloropalladate, and may also include palladium compounds which are soluble in organic solvents such as acetone, diacetone alcohol or methanol, or in mixed solvents of these organic solvents and water. Preferable examples of compounds that can become gold ions include chloroauric acid and water-soluble salts and may also include gold compounds which are soluble in organic solvents such as acetone, diacetone alcohol or methanol, or in mixed solvents of these organic solvents and water.

Methods of preparing a nucleus mixture containing a plurality of metals, such as palladium sulfide and gold sulfide include, for example: a method that involves adding, while stirring, a mixed solution of a plurality of metal ions of palladium, gold, etc. used for the formation of a nucleus mixture, to a charging vessel containing in advance a binder solution to be mentioned below and a sulfide ion solution; a method that involves adding, while stirring, a sulfide ion solution to a charging vessel containing in advance a binder solution and a mixed solution of a plurality of metal ions; or a method that involves adding, while stirring, a mixed solution of a plurality of metal ions, and a sulfide ion solution, at the same time or at intervals, to a charging vessel containing a binder solution only; and other methods.

The silver deposition nucleus obtained as described above are preferably contained in a light-sensitive composition of the invention in an amount of from 1 to 30% by mass, more preferably in the range of from 3 to 20% by mass. The determination of the deposition nucleus can be carried out by means of a fluorescent X-ray measurement apparatus, e.g., a X-RAY SPECTROMETER 3370 manufactured by Rigaku, or another apparatus.

Photopolymerization Initiator

A photopolymerization composition of the invention, which is cured by exposure to form a pattern, preferably includes a photopolymerization initiator that can generate an initiating species by exposure and a photopolymerizable monomer that is cured by polymerization reaction caused by the initiating species.

Examples of a photopolymerization initiator that can be used in the invention include a vicinal polyketaldonyl compound disclosed in U.S. Pat. No. 2,367,660, an acyloin ether compound described in U.S. Pat. No. 2,448,828, an aromatic acyloin compound substituted by α-hydrocarbon described in U.S. Pat. No. 2,722,512, a polynuclear quinine compound described in each specification of U.S. Pat. Nos. 3,046,127 and 2,951,758, a combination of a triarylimidazole dimmer and p-aminoketone described in U.S. Pat. No. 3,549,367, a benzothiazole compound and a trihalomethyl-s-triazine compound described in Japanese Patent Application Publication (JP-B) No. 51-48516, a trihalomethyl-s-triazine compound described in U.S. Pat. No. 4,239,850, a trihalomethyloxadiazole compound described in U.S. Pat. No. 4,212,976, and other compounds. Of these, more preferable compounds include a trihalomethyl-s-triazine, a trihalomethyloxadiazole, a triarylimidazole dimmer, Michler's ketone, and benzyldimethylketal.

These photopolymerization initiators may be used singly or in a mixture of two or more thereof.

The content of photopolymerization initiator in a light-sensitive composition of the invention is preferably from 0.5 to 20% by mass in terms of the solid component from the viewpoints of sensitivity and image intensity formed, more preferably from 2 to 15% by mass.

In the invention, a light-sensitive polymer compound may also be used as a photopolymerization initiator. Examples of this light-sensitive polymer compound include polymer compounds containing therein a cinnamoyl group, a maleimide group, or the like.

The specific examples may include light-sensitive polymer compounds described in JP-A No. 2-157762, U.K. Patent Nos. 1112277, 1313390, 1341004 and 1377747, etc.

This light-sensitive polymer compound may be used in place of the above photopolymerization initiator or in addition thereto. A preferable amount of a light-sensitive polymer compound added in the light-sensitive composition is in the range of from 20 to 80% by mass in terms of the solid component.

Photopolymerizable Monomer

As photopolymerizable monomers to be suitably used in the invention, compounds which have at least one addition polymerizable, ethylenic unsaturated group and which have a boiling point of 100° C. or more at normal pressure are included.

More specifically, the examples may include single-functional acrylates or single-functional methacrylates such as polyethylene glycol mono(meth)acrylate, polypropylene glycol mono(meth)acrylate, and phenoxyethyl(meth)acrylate; polyethylene glycol di(meth)acrylate, polypropylene glycol di(meth)acrylate, trimethylolethane tri(meth)acrylate, trimethylolpropane tri(meth)acrylate, trimethylolpropane di(meth)acrylate, neopentylglycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri((meth)acrylate)ether, tri((meth)acryloyloxiethyl)isocyanurate, tri((meth)acryloyloxiethyl) cyanurate, glycerin tri(meth)acrylate, trimethylpropane and compounds that are (meth)acrylated after addition of ethylene oxide or propylene oxide to multi-functional alcohols such as glycerin; an urethane acrylate described in each of JP-B Nos. 48-41708, 50-6034, and 51-37193, a polyester acrylate, a multi-functional (meth)acrylate of an epoxyacrylate of a reaction product of a epoxy resin and (meth)acrylic acid or the like described in each gazette of JP-A No. 48-64183 and JP-B Nos. 49-43191 and 52-30490; and other photopolymerizable monomers.

Of these, more preferable examples may include, from the standpoints of polymerization properties and layer strength after polymerization, trimethylolpropane tri(meth)acrylate, pentaerythritol tetra(meth)acrylate, dipentaerythritol hexa(meth)acrylate, dipentaerythritol penta(meth)acrylate.

The content of photopolymerizable monomer in a light-sensitive composition of the invention is preferably from 20 to 80% by mass in terms of the solid component, from the viewpoint of the balance of layer strength after polymerization and developability, more preferably from 40 to 60% by mass.

Binder

A light-sensitive composition of the invention preferably includes an alkali-soluble binder from the viewpoints of layer properties improvement and the removal improvement of light unexposed portions.

As an alkali-soluble binder usable in the invention may make use of, specifically, the combinations of the compounds selected from a wide variety of polymer compounds below. Compounds that can be used in combinations include compounds that are satisfactory in silver deposition nucleus dispersion properties, and good in compatibility with a photopolymerizable monomer and a photopolymerization initiator, and suitable in alkaline developer dissolution properties, organic solvent dissolution properties, strength, softening temperatures, and the like. It is preferable that the binder(s) is(are) selected in accordance with correlation with other use components.

Specific examples of this alkali-soluble binder include copolymers of (meth)acrylic acid and (meth)acrylic acid esters, styrene/maleic anhydride copolymers, reaction products of the copolymers and alcohols, and the like, preferably copolymers of (meth)acrylic acid and (meth)acrylic acid esters.

The mass-average molecular weight of a binder is preferably in the range of from 5,000 to 200,000.

Binders may be used in combination of two or more thereof; a preferable content of binders in a light-sensitive composition is as the total amount of the binders in the range of from 20 to 80% by mass based on the total solid components.

To the light-sensitive composition of the invention may be added as necessary additionally a variety of components such as a thermal polymerization inhibitor, a solvent, an adhesion promoter, in addition to the above components.

When a combination of an addition polymerizable unsaturated monomer (corresponding to a photopolymerizable monomer of the invention) and a photopolymerization initiator are used as the above-mentioned light-sensitive components, the thermal polymerization inhibitor may be added to improve the storage stability of the composition. Examples of the inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, phenothiazine, and the like.

Light-sensitive Transfer Material for Producing Image Receiving Layer for Forming Light Shielding Layer for Display Device Next, a light-sensitive transfer material that is used for producing an image receiving layer (light-sensitive silver deposition nucleus layer) for forming a light shielding layer for a display device of the invention will be explained.

A light-sensitive transfer material for producing an image receiving layer can be obtained by forming an image receiving layer comprising the light-sensitive composition of the invention on a support.

A transfer material in the invention may be a material that has on a support, at least a silver halide-containing layer, and a silver deposition nucleus layer formed with the light-sensitive composition, disposed in this order. Alternatively, a transfer material in the invention may be a material that has on a support, only an image receiving layer to which surface a silver halide emulsion layer may be applied, thereby forming an image.

In either case of the transfer materials, when image formation is carried out by transferring an image to a permanent support such as a glass substrate, a light shielding layer for a display device to be described later is formed, preferably a silver halide emulsion layer is disposed such that the layer is laminated on an image receiving layer.

A support in a transfer material of the invention is generally removed as a temporary support at the time of forming an image or after forming an image, and examples of this support that may be used include well known supports of polyester, polystyrene, and the like. Of these, biaxially-oriented polyethylene terephthalate is preferable from the viewpoints of cost, thermal resistance and dimension stability. The thickness of a support is preferably from about 15 to about 200 μm, from the standpoints of shape stability and dimension stability with respect to heat application in the step of lamination and cost, more preferably from about 30 to about 150 μm.

If necessary, a temporary support may also be provided with an electric conductive layer as described in JP-A No. 11-149008.

A light-sensitive transfer material for producing of an image receiving layer for a light shielding layer for a display device of the invention can be obtained by a process that comprises, as described above, dissolving a light-sensitive composition of the invention in a suitable solvent, applying the resulting solution to a support (may be a temporary support) and drying it to be capable of forming the image receiving layer for producing the light shielding layer for a display device.

Examples of solvents that may be used in application of a light-sensitive composition include benzene, toluene, xylene, cyclohexane, ethylene glycol monomethyl ether, ethylene glycol monoethyl ether, propylene glycol monomethyl ether, propylene glycol monoethyl ether, ethylene glycol monomethyl ether acetate, ethylene glycol monoethyl ether acetate, propylene glycol monomethyl ether acetate, propylene glycol monoethyl ether acetate, acetone, methyl ethyl ketone, methyl isobutyl ketone, cyclohexane, methyl acetate, ethyl acetate, propyl acetate, butyl acetate, methyl lactate, ethyl lactate, methanol, ethanol, 1-propanol, 2-propanol, butanol, sec-butanol, t-butanol, N-methylpyrrolidone, dimethyl formamide, dimethyl acetoamide, γ-butyrolactone, ε-caprolactam, dimetylsulfoxide, hexamethylphosphoramide, water, and the like. These may be used singly, or according to the purpose, used as a mixture of two or more thereof.

The method of coating is not particularly limited, and a well known method may be applied that involves coating by a coating machine such as a spinner (the spin method, the slit and spin method), a whiler, a roller coater, a curtain coater, a knife coater, a wire bar coater, an extruder (the FAS method, or the like), etc. and drying it. When a layer of an alkali-soluble thermoplastic resin is prepared as described below, the layer may be formed as described above.

The amount of coating of an image receiving layer is selected according to the purpose, and in general the amount of coating after the coating is dried is preferably from 0.2 to 2.0 μm.

In a transfer material of the invention, the release layer or the protective layer may be applied on the image receiving layer containing a silver deposition nucleus for the purpose of the prevention of scratch generation on the image receiving layer containing the silver deposition nucleus.

Thermoplastic Resin Layer

In a transfer material of the invention, a thermoplastic resin layer is preferably placed between the support and the image receiving layer, or between the support and an intermediate layer as will be described below.

The thermoplastic resin layer functions as a cushion material that can cover up unevenness of the support surface, or smooth out, for example, bumps appearing on the support surface due to image formed thereon. The thermoplastic resin layer is preferably formed with a resin that exhibits properties capable of changing shape according to the bumps.

Preferable examples of the resins used for the thermoplastic resin layer of the invention include phenol resins, polyamide resins, fluororesins, polyacetal resins, ABS resins, polyimide, polyethylene, polyvinyl chloride, polycarbonate resins, methacrylic resins, polypropylene, polystyrene, urea resins, epoxy resins, diallyl phthalate resins, PRO NORYL resins. Specific examples thereof include, for example, resins described in Table 1.1 on page 102 and Table 1.2 on page 103 of "Kobunshi Zairyo Binran (Polymer Material Handbook)" (edited by The Society of Polymer Science, Japan, published by Corona Publishing Co., Ltd., on Feb. 20, 1973).

Further, the thermoplastic resin layer of the invention is preferably an alkali-soluble thermoplastic resin layer from the viewpoint of improvement in film property, removability of a non-exposed portion, and the like.

As a resin contained in the alkali-soluble thermoplastic resin layer, at least one selected from saponified substances of ethylene and acrylic acid ester copolymers, saponified substances of styrene and (meth)acrylic acid ester copolymers, saponified substances of vinyl toluene and (meth)acrylic acid ester copolymers, poly(meth)acrylic acid esters, and (meth)acrylic acid ester copolymers of butyl(meth)acrylate and vinyl acetate or the like is preferably used. The organic polymers that are described in "Plastic Seinoh Binran (Plastic Performance Handbook)"(written and edited by The Japan Plastics Industry Federation and Zennippon Plastics Seikei Kogyo Rengokai, published by Kogyo Chosakai Publishing Inc., on Oct. 25, 1968) and soluble in an aqueous alkaline solution may also be used. Of these thermoplastic resins, substances having a softening point of 80° C. or less are preferable. In the present description, both or one of acrylic acid and methacrylic acid may be called "(meth)acrylic acid" and the same goes for the derivatives thereof.

As a component of the thermoplastic resin layer, of the above described resins, it is preferable to use a resin having physical properties of a mass-average molecular weight between 50,000 and 500,000 (Tg=0 to 140° C.), and more preferably a resin having a mass-average molecular weight between 60,000 and 200,000 (Tg=30 to 110° C.).

Specific examples of resins that may be used include the resins soluble in an alkaline solution, described in each gazette description of JP-B Nos. 54-34327, 55-38961, 58-12577 and 54-25957, JP-A No. 61-134756, JP-B No. 59-44615, JP-A Nos. 54-92723, 54-99418, 54-137085, 57-20732, 58-93046, 59-97135, and 60-159743, OLS (DE) No. 3504254, JP-A Nos. 60-247638, 60-208748, 60-214354, 60-230135, 60-2585539, 61-169829, 61-213213, 63-147159, 63-213837, 63-266448, 64-55551, 64-55550, 2-191955, 2-199403, 2-199404, and 2-208602. More preferable examples include a methacrylic acid/2-ethylhexyl acrylate/benzyl methacrylate/methyl methacrylate copolymer described in the description of JP-A No. 63-147159.

As a component of the thermoplastic resin layer, of the above described resins, it is preferable to use, together with the resins having a mass-average molecular mass between 50,000 to 500,000, a resin having physical properties of a mass-average molecular weight between 3,000 to 30,000 (Tg=30 to 170° C.), and more preferably a resin having a mass-average molecular weight between 4,000 and 20,000 (Tg=60 to 140° C.).

Preferable specific examples can be selected those of described in above-mentioned patent specification. And more preferable example is stylene/(meth)acrylate copolymer described in the description of JP-B No. 55-38961 and JP-A No. 5-241340 respectively.

To an organic polymer composition constituting these thermoplastic resin layers, a variety of plasticizers, a variety of polymers and supercooling material, an adhesion improver or a surfactant, a releasing agent, or the like may be added.

Preferable examples of plasticizers may include polypropylene glycol, polyethylene glycol, dioctyl phthalate, diheptyl phthalate, dibutyl phthalate, tricresyl phthalate, dibutyl phthalate, tricresyl phosphate, cresyldiphenyl phosphate, biphenyldiphenyl phosphate, polyethylene glycol mono(meth)acrylate, polyethylene glycol di(meth)acrylate, polypropylene glycol mono(meth)acrylate, polypropylene glycol di(meth)acrylate, a product of addition reaction of an epoxy resin with polypropylene glycol mono(meth)acrylate, a product of addition reaction of an organic diisocyanate with polyethylene glycol mono(meth)acrylate, a product of addition reaction of an organic diisocyanate with polypropylene glycol mono(meth)acrylate, a product of condensation reaction of bisphenol A with polypethylene glycol mono(meth)acrylate, and the like.

The amount of plasticizer in an alkali-soluble thermoplastic resin layer is generally 200% by mass or less relative to the thermoplastic resin, and preferably from 20 to 100% by mass.

The thickness of an alkali-soluble thermoplastic resin layer is preferably 6 μm or more. If the thickness of the thermoplastic resin is 6 μm or more, the irregularities of the ground surface can completely be absorbed. The upper limit is generally about 100 μm or less from the viewpoints of developability and production suitability, and preferably about 50 μm or less.

In the invention, the solvent that may be used for the thermoplastic resin layer is not particularly limited as long as the solvent can dissolve a resin contained in the layer thereof. The examples of the solvent include methyl ethyl ketone, cyclohexane, propylene glycol monomethyleter acetate, n-propanol, isopropanol, and the like.

Intermediate Layer

In a light-sensitive transfer material of the invention, an intermediate layer may be disposed between the support and the image receiving layer. It is preferable that the intermediate layer functions as a protective layer of the image receiving layer, i.e., an oxygen impermeable layer, after the transfer.

The resin contained in the intermediate layer is not particularly restricted as long as it is alkali-soluble. Examples of the resin may include a polyvinyl alcohol-based resin, a polyvinyl pyrrolidone-based resin, a cellulose-based resin, an acryl amide-based resin, a polyethylene oxide-based resin, gelatin, a vinyl ether-based resin, a polyamide resin, and copolymers thereof. Also, a resin may also be used that is produced by copolymerization of a resin that is normally alkali-insoluble like a polyester with a monomer having a carboxylic group or a sulfone group.

To an intermediate layer may be added as necessary an additive such as a surfactant.

The thickness of an intermediate layer is preferably from about 0.1 to 5 μm, from the viewpoints of the balance of oxygen impermeable properties and removal properties of the intermediate layer during development, and more preferably in the range of from 0.5 to 3 μm.

The coating solvent of an intermediate layer does not particularly have other limits as long as the above resin is dissolved therein; however, water is preferable. A mixture solvent of water and the above water-miscible organic solvent is also preferable. Preferable, specific examples include water, water/methanol=90/10, water/methanol=70/30, water/methanol=55/45, water/methanol=70/30, water/1-propanol=70/30, water/acetone=90/10, water/methyl ethyl ketone=95/5 (wherein, the mixing ratio is by weight ratio).

In the transfer material of the invention, one side of the support may be coated with an image receiving layer containing a silver deposition nucleus; the other side of the support may be coated with a back layer. Also, an image stabilizing layer may be formed between the alkali neutralization layer and the neutralization timing layer, and a protective layer may be formed on the image receiving layer containing a silver deposition nucleus. When a cellulose ester is used as a binder for a silver deposition nucleus, it is preferable that the cellulose ester is all or partially hydrolyzed in advance for the production of hydrophilic reproduced cellulose by means of an aqueous solution of alkali such as sodium hydroxide or potassium hydroxide, a mixture solution of the aqueous alkali/alcohol, or an alcohol solution of the alkali, since an alkaline developer or a silver ion complex is readily permeated into and diffused in an image receiving sheet.

In order to improve the preservability of a silver image formed in the invention, a layer for capturing a halide ion may be formed between the image receiving layer containing a silver deposition nucleus and the support, or, for example, an image preservation improver as described in JP-A No. 59-231537 may be contained in the image receiving layer.

Processing Method

A transfer material of the invention obtained as described above is cut into a desirable size for use, and the processing method of doing so, and thus the cutting method during the process is not particularly limited; a well known method is applicable.

Light Shielding Layer for Display Device and Producing Method Thereof

The light-sensitive silver deposition nucleus layer or the light-sensitive image receiving layer containing a silver deposition nucleus is exposed to light imagewise, and developed.

A patterned silver deposition nucleus layer or an image receiving layer which is cured only in the light exposed region is thus obtained.

Treating the silver deposition nucleus with a silver halide emulsion causes deposition of silver on the silver deposition nucleus and the patterned silver deposition nucleus layer or an image receiving layer to be colored, which forms an image to produce a silver deposition layer functioning as a light shielding layer. The light shielding layer region can be used as a light shielding layer for a display device.

In other words, a light shielding layer for a display device of the invention can be obtained by forming the light shielding layer by using the light-sensitive composition for producing the image receiving layer for the light shielding layer for a display device of the invention described above and the light-sensitive transfer material for producing the image receiving layer for the light shielding layer for a display device of the invention, which uses the light-sensitive composition as the image receiving layer.

A light shielding layer for a display device of the invention may be obtained by the producing methods described below.

A first producing method for a light shielding layer for a display device includes: forming on a light transmitting substrate a light-sensitive silver deposition nucleus layer containing at least one type of silver deposition nucleus, a photopolymerization initiator, a photopolymerizable monomer, and a binder; subjecting the light-sensitive silver deposition nucleus layer to imagewise exposure to cure the light exposed portion; developing by removing the image forming layer of the non-exposed portion with a developer; applying thereto a silver complex treating solution to deposit the silver on the silver deposition nucleus, whereby an image portion, i.e., a patterned light shielding layer is formed to obtain a light shielding layer for a display device.

A second producing method for a light shielding layer for a display device includes: forming on a light transmitting substrate a light-sensitive silver deposition nucleus layer containing at least one type of silver deposition nucleus, a photopolymerization initiator, a photopolymerizable monomer, and a binder; applying thereto a silver complex treating solution containing a silver halide solvent to deposit the silver on the silver deposition nucleus; forming a silver deposition pattern by exposure and development, whereby an image portion, i.e., a patterned light shielding layer is formed to obtain a light shielding layer for a display device.

Silver Halide Emulsion

Next, a silver halide emulsion will be explained. A silver halide emulsion may be used by the contact of a light-sensitive layer containing one or more types of silver halide emulsions formed on the support with the image receiving layer, or by the application of a light-sensitive composition coating solution onto the image receiving layer surface.

A silver halide emulsion may be selected from the well known silver halide emulsions which are used in the field of silver salt photography. Silver iodobromide of high sensitivity (iodine content of 1 to 10 mol %) is particularly preferable as a silver halide. These can be used by dispersion in a suitable protecting colloidal substance such as gelatin, casein, albumin, polyvinyl alcohol, polyacrylamide, or the like.

An emulsion suitable for this application can be prepared by the method described in "Chimie et Physique Photographique" written by P. Glafkides, published by Paul Montel Corp., 1967, "Photographic Emulsion Chemistry" written by G. F. Duffin, published by The Focal Press Corp., 1966, "Making and Coating Photographic Emulsion" written by V. L. Zelikman et al., published by The Focal Press Corp., 1964, etc.

These silver halide emulsions can be subjected to chemical sensitization, spectral sensitization, and color intensifying sensitization, as necessary.

Also, thereto can be added an antifoggant, a hardening agent, a development accelerator, a surfactant, an antistatic agent, etc.

It is preferable that the silver halide emulsion is added to the silver complex treating solution in advance or is applied onto the silver deposition nucleus layer by using a binder such as a gelatin and PVA.

Silver Complex Treating Solution

A silver halide solvent used in the silver complex treating solution in the invention will be explained. As silver halide solvents, those used as "fixing agents" in the field of silver salt photography may be used.

Specific examples of the silver halide solvent include thiosulphates and cyanates. Sodium thiosulphate, ammonium thiosulphate, sodium cyanate or the like may be used as a silver halide solvent. A combination of a cyclic imide and ammonia or an amine (e.g. a combination of uracil and an amine) is also preferably used as a silver halide solvent.

The silver complex treating solution of the invention may further contain, besides the silver halide solvent, a silver halide developing agent, and/or an alkaline agent, as necessary.

Suitable silver halide developing agents include benzene derivatives in which at the ortho and para positions of the benzene ring are replaced by at least two hydroxyl and/or amino groups. Examples thereof include hydroquinone, amidol, methol, glycine, p-aminophenol and pyrogallol and hydroxylamines, particularly primary and secondary aliphatic and aromatic N-substituted amines or β-hydroxylamines, which are soluble in aqueous alkali, for example, hydroxylamine, N-methylhydroxylamine, N-ethylhydroxylamine, and amines described in U.S. Pat. No. 2,857,276 and N-alkoxyalkyl substituted hydroxylamines as described in U.S. Pat. No. 3,293,034. A hydroxylamine derivative having a tetrahydrofurfuryl group described in JP-A No. 49-88521 is also used. A minoreductons described in OLS (DE) Nos. 2,009,054 and 2,009,055, and heterocyclic aminoreductons described in U.S. Pat. No. 4,128,425 are used as well. Also, a tetraalkylreductic acid described in U.S. Pat. No. 3,615,440 can be used as well.

The above developer may be used together with an auxiliary developing agent such as a phenidone compound, a p-aminophenol compound or ascorbic acid. Suitable silver halide solvents include general fixing agents such as sodium thiosulfate, sodium thiocyanate, ammonium thiosulfate and substances described in U.S. Pat. No. 2,543,181, and combinations of cyclic imides and nitrogen bases, such as barbiturates, or combinations of uracil and ammonia or amines, and combinations as described in U.S. Pat. No. 2,857,274.

Additionally, a silver halide is added to the above treatment element, whereby a pattern-formed silver deposition nucleus can be developed.

As an alkaline agent, any material may be used without limitation as long as it increases the pH of the silver complex treating solution. Preferable examples of the alkaline agent include sodium hydroxide and potassium hydroxide.

The temperature for treatment with the silver complex treating solution of the invention is preferably 0 to 50° C., and more preferably 5 to 35° C. The duration of treatment with the silver complex treating solution is preferably 10 seconds to 30 minutes, and more preferably, 15 seconds to 10 minutes.

If the treatment temperature is too low or the treatment duration is too short, the optical density of the light shielding layer may be insufficient. If the treatment temperature is too high or the treatment duration is too long, the color tone of the light shielding layer may deteriorate or the reflectance thereof may increase.

It is preferable that, in the treatment with the silver complex treating solution of the invention, the silver complex treating solution is used in an amount of about 100 to 100,000 g of silver deposited with respect to 1 g of silver deposition nucleus, and more preferably, about 500 to 5,000 g of silver with respect to 1 g of silver deposition nucleus. If the amount is too little, the optical density of the light shielding layer may be insufficient. If the amount is too large, it is disadvantageous from a cost viewpoint.

A light-sensitive transfer material of the invention has a light-sensitive shielding layer made of an image receiving composition as above mentioned, and thus a light shielding layer for a display device which is thin and has a high optical density can be produced therefrom.

The wall thickness of a light shielding layer constituting a light shielding layer for a display device of the invention, thus produced, is from about 0.2 to about 1.0 μm, preferably 0.6 μm or less. A light shielding layer in a light shielding layer for a display device of the invention is made by deposition of an silver deposition nucleus having high suppression capacity, and so the light shielding layer even being a thin layer above mentioned has a sufficient optical density.

Forming this light shielding layer into a pattern suitable for a light shielding layer for a display device may include exposing the image receiving material to light by the usual method via a photomask for a light shielding layer for a display device, and subsequently developing the resulting material. This pattern exposure cures only the light exposed portion of an image receiving layer comprising a light-sensitive composition for producing an image receiving layer to produce a light shielding layer for a display device containing a silver deposition nucleus, i.e., a coloring element.

Coloring the pattern-like image receiving layer thus formed may utilize the above silver halide emulsion; however, the method is selected arbitrary.

A method for application of a silver halide emulsion may be a method that involves preparing on a light transmitting substrate a laminated material having a light-sensitive layer containing a silver halide emulsion, exposing to light the image receiving layer comprising a light-sensitive composition of the invention through a photomask for a light shielding layer for a display device and developing it, disposing and laminating the light-sensitive layer on the image receiving layer pattern surface thus formed such that both are made in contact with each other, applying them for a specified time, and then releasing the light-sensitive layer to form a light shielding layer for a display device.

A light shielding layer for a display device may also be obtained by a process that involves exposing to light a transfer material comprising a light-sensitive composition of the invention through a photomask for a light shielding layer for a display device and developing it, applying a composition coating solution containing a silver halide emulsion to the image receiving layer pattern surface, applying them for a specified time, and then releasing the coating solution, and then coloring the cured pattern to form the light shielding layer. Also, after exposure through a photomask for a light shielding layer for a display device, a developer containing a silver halide emulsion is applied to the image receiving layer pattern surface by the applying method, and then the development and coloring can be carried out at the same time.

Furthermore, the combination of the transfer method and the applying method may form a light shielding layer having desirable characteristics to obtain a light shielding layer for a display device as well.

A method of producing a light shielding layer for a display device of the invention does not need to carry out a complicated step and thus is performed at a low cost.

Developer

As aqueous alkaline solutions to be used in the process of development, a dilute aqueous solution of an alkaline substance is preferred and also a solution that additionally contains a small amount of an organic solvent that is miscible with water. Suitable alkaline substances include alkaline metal hydroxides (e.g., sodium hydroxide, potassium hydroxide), alkaline metal carbonates (e.g., sodium carbonate, potassium carbonate), alkaline metal bicarbonates (sodium bicarbonate, potassium bicarbonate), alkaline metal silicates (sodium silicate, potassium silicate), alkaline metal metasilicates (sodium metasilicate, potassium metasilicate), triethanolamine, diethanolamine, monoethanolamine, morpholine, tetraalkylammonium hydroxides (e.g., tetramethylammonium hydroxide) and trisodium phosphate.

The concentration of an alkaline substance is from 0.01% to 30% by mass, and the pH is preferably from 8 to 14.

When a developer is made to contain the above silver halide emulsion, the addition amount of silver halide is preferably in the range of from 0.3 to 3 moles based on one mole of the silver halide dissolving substance.

Color Filter

A color filter of the invention comprises a colored layer on a light transmitting substrate and a color filter having two or more pixel groups that exhibits colors different from each other. Each pixel constituting the pixel groups is separated from each other by a light shielding layer for a display device. The light shielding layer for a display device is a light shielding layer for a display device of the invention that is produced by using the image receiving layer composition for producing a light shielding layer for a display device or the light-sensitive transfer material, of the invention.

The number of pixel groups may be two or three or four or more groups. For instance, when the number is three, three colors of red (R), green (G), and blue (B) are used. Where the pixel groups of three kinds of red, green and blue are disposed, the configuration of a mosaic type, a triangle type or the like is preferable; where the pixel groups of four or more are disposed, any configuration may be acceptable.

As light transmitting substrates used in the color filter, well known glass plates such as a soda glass plate having a silicon oxide film on the surface thereof, a heat resistance glass plate, a non-alkali glass plate, and a quartz glass plate, or a plastic film and the like are included.

The production of a glass filter may involve forming two or more pixel groups on a light transmitting substrate by the usual process and then forming a light shielding layer for a display device as described above, or first forming a light shielding layer for a display device and subsequently forming two or more pixel groups.

A color filter of the invention, which is equipped with a light shielding layer for a display device like the above, is high in display contrast and excellent in evenness.

Liquid Crystal Display Element

A liquid crystal display element of the invention includes at least a color filter, a liquid crystal layer and a liquid crystal driver (including the simple matrix driving method and the active matrix driving method) between a pair of substrates at least one of which has light transmitting properties; the color filter has a plurality of pixel groups as above mentioned, and each pixel constituting the pixel group is separated from each other by a light shielding layer for a display device of the invention.

Because of a high evenness of the color filter, a liquid crystal display element having the color filter does not generate cell gap unevenness between the color filter and the substrate, thereby not producing display failures such as color unevenness.

The liquid crystal display element of another aspect of the invention includes at least a color filter, a liquid crystal layer and a liquid crystal driver between a pair of substrate at least one of which has a light transmitting properties. The liquid crystal driver has active elements (e.g., TFT). Between the active elements, a light shielding layer for a display device which is produced by using the image receiving layer composition for producing a light shielding layer for a display device or the light-sensitive transfer material, of the invention, is formed.

Substrate Having Light Shielding Layer for Display Device

A substrate having a light shielding layer for a display device of the invention has a light shielding layer disposed on the light transmitting substrate. When the light shielding layer is formed, a silver complex diffused in a silver deposition pattern is deposited as silver fine particles. This causes differences in particle size, aspect ratio, volume fraction, and the like of the silver fine particles depending on the position in a direction of thickness of the image receiving layer. The light shielding layer obtained is thus nearly achromatic and of pure black unlike a light shielding layer formed by using silver fine particles having a sharp particle size distribution. Further, since the silver fine particles at a deeper position in a thickness direction have a smaller volume fraction, the silver fine particles do not fuse with each other even if they are heated. Therefore, the light shielding layer exhibits pure black color when observed from the rear face and is preferable as a light shielding layer for a display device.

Also, a substrate having a light shielding layer for a display device of the invention can be used for the production of a color filter.

The layer thickness of a light shielding layer on the substrate having a light shielding layer for a display device is preferably from 0.2 to 2.0 µm, and more preferably from 0.2 to 0.9 µm. A light shielding layer in a substrate having a light shielding layer for a display device of the invention has a sufficient optical density even being a thin layer as above mentioned since the light shielding layer is produced by the dispersion of silver fine particles.

EXAMPLES

Hereinafter, the present invention will be explained in more detail specifically in terms of Examples; however, the invention is by no means limited to only the Examples thereof.

Example 1

1. Production of Image Receiving Material

Preparation of Light-Sensitive Image Receiving Layer Coating Solution Containing Silver Deposition Nucleus To a vessel containing a solution prepared by the dissolution of 24.3 g of a benzylmethacrylate/methacrylic acid copolymer (molar ratio=73/27, mass-average molecular weight=30000) in 380 g of acetone and 308 g of methyl ethyl ketone was added a mixture solution of 16 ml of a 0.07 M aqueous sodium sulfide nonahydrate solution and 36 ml of acetone at a speed of 1 ml per second with agitation at 550 rpm; the agitation was made to continue for two minutes; thereto was added a mixture solution of 16 ml of a 0.070 M aqueous palladium tetrachloride disodium trihydrate solution and 36 ml of methanol at a speed of 1 ml and then the agitation was made to continue for five minutes. These operations were carried out at 25° C.

Next, to the resulting solution were added 17.3 g of a benzylmethacrylate/methacrylic acid copolymer (molar ratio=78/22, mass-average molecular weight=40000), 132 g of methoxypropylene glycol acetate, 39.5 g of dipentaerythritol hexaacrylate, 2.02 g of 2-trichloromethyl-5-(P-styryl-styryl)-1,3,4-oxadiazole, 0.2228 g of phenothiazine and 1.194 g of MEGAFACE F176 PF (a fluorine-based surfactant manufactured by Dainippon Ink and Chemicals, Inc.) and the resulting material was stirred, whereby a light-sensitive composition containing a silver deposition nucleus which is used as a light-sensitive image receiving layer coating solution containing a silver deposition nucleus was obtained.

Formation of Light-Sensitive Image Receiving Layer Containing Silver Deposition Nucleus The light-sensitive image receiving layer coating solution containing a silver deposition nucleus was applied to a glass substrate with a spin coater in such a way that the layer thickness became 0.2 µm, and the resulting substrate was dried at 100° C. for 5 minutes, whereby a light-sensitive image receiving layer containing a silver deposition nucleus was formed. Then, a protective layer coating solution indicated below was applied thereto so that the dried layer thickness became 1.5 µm, and the resulting substrate was dried at 100° C. for 5 minutes, whereby a light-sensitive image receiving material containing a silver deposition nucleus was obtained.

| Protective Layer Coating solution | |
|---|---|
| Polyvinyl alcohol (PVA205 manufactured by Kuraray Co., Ltd.) | 3.0 parts by mass |
| Polyvinyl pyrrolidone (PYP-K30 manufactured by GAF Corporation) | 1.3 parts by mass |
| Distilled water | 50.7 parts by mass |
| Methyl alcohol | 45.0 parts by mass |

2. Production of Light Shielding Layer for Display Device

Exposure and Development

The applied surface of the image receiving material obtained as described above was exposed to light with surface energy of 70 mJ/cm² by means of an ultra-high pressure mercury lamp through a photomask for a light shielding layer for a display device. Thereafter, the resulting image receiving material was developed at 33° C. for 20 seconds with a developer TCD (alkaline developer manufactured by Fuji Photo Film Co., Ltd.), and the resultant material was rinsed with water, and then water was removed and dried with an air knife. Then, the resulting material was heated at 240° C. for 50 minutes, whereby a pattern of an image receiving layer containing silver deposition nucleuses (silver deposition nucleus pattern) was formed.

Preparation of Silver Complex Treating Solution

A silver complex treating solution was prepared that has the following composition:

| | |
|---|---|
| 40% Aqueous potassium hydroxide solution | 323 ml |
| Zinc oxide | 9.75 g |
| N,N-bis-methoxyethylhydroxyamine | 75 g |
| Aqueous triethanolamine solution | 17.14 g |
| (4.5 parts of triethanolamine relative | |
| to 6.2 parts of water) | |
| Tetrahydropyrimidinethion | 0.4 g |
| 2,4-Dimercaptopyrimidine | 0.35 g |
| Uracil | 80 g |
| Water | 1193 g |

A silver complex treating solution containing an emulsion prepared by further adding silver iodobromide having an average particle size of 1.1 μm (AgI content of 6.0 mol %, homogeneous structure), 4-hydroxy-6-methyl-1,3,3a,7-tetrazainden, and the sensitizing dyes represented by Chemical Formulae (A), (B) and (C) shown below to the above solution so that each amount of the chemicals became the amount indicated below was applied to the pattern of the silver deposition nucleus layer at a dried layer thickness of 40 μm.

Silver iodobromide 2.0 in terms of silver (coating amount by $g/m^2$ in terms of the solid component)

4-Hydroxy-6-methyl-1,3,3a,7-tetrazynden 0.01 (coating amount by $g/m^2$ in terms of the solid component)

Sensitizing dye below (A) $3.2 \times 10^{-4}$ (coating amount by $g/m^2$ in terms of the solid component)

Sensitizing dye below (B) $3.2 \times 10^{-4}$ (coating amount by $g/m^2$ in terms of the solid component)

Sensitizing dye below (C) $1.2 \times 10^{-4}$ (coating amount by $g/m^2$ in terms of the solid component)

Samples of a light-sensitive silver nucleus layer and a protective layer formed on a glass substrate were thus obtained.

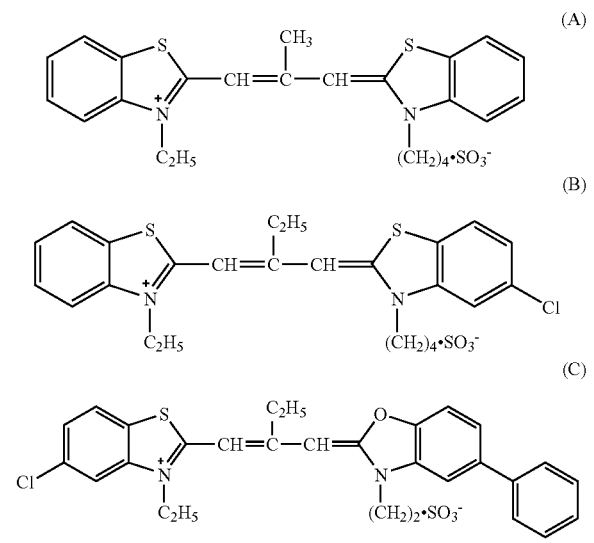

After application, the pattern was kept at 25° C. for 40 seconds to deposit the silver on the silver deposition nucleus. Thereafter, the residual silver complex treating solution was removed with distilled water of 30° C. and then the water was removed with an air knife and dried. This treatment carries out removal of the uncured image receiving layer and formation of a patterned light shielding layer by black color development of the cured image receiving layer pattern in one step, thereby obtaining the light shielding layer for a display device of Example 1 having a patterned light shielding layer.

Evaluation of Light Shielding Layer for Display Device

1. Layer Thickness Determination

The layer thickness was determined by the following method. The method includes exposing to light the applied surface of the sample, to which an image receiving layer was applied, by means of an ultra-high pressure mercury lamp at an exposure energy of 70 $mJ/cm^2$ to cure the image receiving layer, determining the layer thicknesses of the image receiving layer forming region and the unformed region (region of the support only) in the formed light shielding layer for a display device by means of a probe type surface roughness meter P-1 (manufactured by TENKOP Corp.) and subtracting both thicknesses, thereby determining the thickness of the image receiving layer.

2. Determination of Optical Density

The optical density of a layer was determined by the following method. The applied surface of a silver deposition layer applied to the surface of a glass substrate is exposed to light with an ultra-high pressure mercury lamp at an exposure energy of 500 $mJ/cm^2$, and then the optical density is determined with a MACBETH density meter (TD-904 manufactured by Macbeth Corp.) (OD). Separately, the optical density ($OD_0$) of the glass substrate is determined with the same method, and the difference between them and thus the value obtained by the subtraction of $OD_0$ from OD is set equal to the optical density.

3. Formation of Blue, Red and Green Pixels and Evaluation of Air Bubble of Pixel The pixels of each color were formed on a glass substrate, on which a light shielding layer for a display device, by use of the samples R1, G1 and B1 described in Example-1 of JP-A No. 2002-341127. The method of forming pixels used the method of the patent descriptions.

Because the pixels of each color are formed on the irregularities of a light shielding layer for a display device, air bubbles enter in between the glass substrate and the pixels of each color in some cases. The degrees of the air bubbles were determined by the following method.

The number of air bubbles was counted for 100 pixels of each of the three colors of the glass substrate, totaling 300 pixels, under an optical microscope. The smaller the number, the better the quality is.

4. Color Changes of Light Shielding Layers for Display Device by Heat Application The changes of the colors of a light shielding layer for a display device prior to and subsequent to heat treatment at 220° C. for two hours of a glass substrate having the light shielding layer for a display device formed thereon were visually evaluated. In the following evaluation levels, substantially allowable levels are from levels A to C.

| | |
|---|---|
| Completely no changes are observed | A |
| Quite slight metal brightness is observed | B |
| Slight metal brightness is present, however, substantially allowable | C |
| Metal brightness is present that becomes obstacles for practical use | D |
| Clear metal brightness is observed | E |

The results for the evaluations indicated above are summarized in Table 1.

Examples 2 to 7

Light shielding layers for a display device were formed as in Example 1 except that a 0.070 M aqueous chloroauric acid solution (Example 2), a 0.070 M aqueous iridium chloride solution (Example 3), a 0.070 M aqueous cupric chloride solution (Example 4), a 0.070 M aqueous chloroplatinic acid solution (Example 5), a 0.070 M aqueous osmium dichloride solution (Example 6) and a 0.070 M aqueous silver nitrate solution (Example 7) were used in place of the 0.070 M aqueous palladium tetrachloride disodium trihydrate solution used in the formation of silver deposition nucleuses in Example 1, and the same evaluations as in Example 1 were carried out. The results are tabulated in Table 1.

Examples 8 to 11

Light shielding layers for a display device were formed as in Example 1 except that a 0.070 M aqueous palladium tetrachloride disodium trihydrate solution, a 0.070 M aqueous chloroauric acid solution and a 0.070 M aqueous silver nitrate solution were used together in the ratios indicated in Table 1 in place of the 0.070 M aqueous palladium tetrachloride disodium trihydrate solution used in the formation of silver deposition nucleuses in Example 1, and the same evaluations as in Example 1 were carried out. The results are tabulated in Table 1.

Example 12

To the light-sensitive image receiving layer containing a silver deposition nucleus formed in Example 1, a silver halide emulsion prepared by adding silver iodobromide having an average particle size of 1.1 μm (AgI content of 6.0 mol %, homogeneous structure), 4-hydroxy-6-methyl-1,3,3a,7-tetrazainden, and the sensitizing dyes represented by Chemical Formulae (A), (B) and (C) so that each coating amount of the chemicals became the amount indicated below was applied.

Silver iodobromide 2.0 in terms of silver (coating amount by g/m$^2$ in terms of the solid component)
4-Hydroxy-6-methyl-1,3,3a,7-tetrazynden 0.01 (coating amount by g/m$^2$ in terms of the solid component)
Sensitizing dye (A) $3.2 \times 10^{-4}$ (coating amount by g/m$^2$ in terms of the solid component)
Sensitizing dye (B) $3.2 \times 10^{-4}$ (coating amount by g/m$^2$ in terms of the solid component)
Sensitizing dye (C) $1.2 \times 10^{-4}$ (coating amount by g/m$^2$ in terms of the solid component)
Gelatin 2.0 (coating amount by g/m$^2$ in terms of the solid component)

Further, the protective layer coating solution described in Example 1 was applied thereon so as to obtain a dried layer thickness of 1.5 μm, to form a light-sensitive image receiving material containing a silver deposition nucleus. The applied surface of the light-sensitive image receiving material containing a silver deposition nucleus thus obtained was exposed to light with surface energy of 70 mJ/cm$^2$ by means of an ultra-high pressure mercury lamp through a photomask for a light shielding layer for a display device.

Next, a solution of 10° C. having the following composition was applied thereto at a thickness of 40 μm, then kept at 10° C. for 50 seconds to deposit the silver on the silver deposition nucleus.

| | |
|---|---:|
| 40% Aqueous potassium hydroxide solution | 323 ml |
| Zinc oxide | 9.75 g |
| N,N-bis-methoxyethylhydroxyamine | 75 g |
| Aqueous triethanolamine solution | 17.14 g |
| (4.5 parts of triethanolamine relative to 6.2 parts of water) | |
| Tetrahydropyrimidinethion | 0.4 g |
| 2,4-Dimercaptopyrimidine | 0.35 g |
| Uracil | 80 g |
| Water | 1193 g |

Thereafter, the residual silver complex treating solution and the silver halide emulsion layer were removed with distilled water of 10° C. Then the water was removed with an air knife and dried, followed by treatment with heat at 240° C. for 50 minutes to obtain a patterned light shielding layer for a display device. The light shielding layer for a display device thus obtained was evaluated as in Example 1.

Examples 13 to 24

Light shielding layers for a display device were formed as in Examples 1 to 12 except that protective layers were not formed on image receiving layer surfaces, and that the amount of exposure was changed from 70 mJ/cm$^2$ to 500 mJ/cm$^2$, and the same evaluations as in Example 1 were carried out. The results are tabulated in Table 1.

TABLE 1

| | Image receiving layer Metal ion of silver deposition nucleuses | Light shielding material | Layer forming method | Protective layer | Optical density | Heat application color change | Layer thickness (μm) | Air bubble (number) |
|---|---|---|---|---|---|---|---|---|
| Example 1 | Palladium 100% | Silver | Coating | Protective layer is present | 4.0 | A | 0.2 | 0 |
| Example 2 | Gold 100% | Silver | Coating | Protective layer is present | 3.8 | A | 0.2 | 0 |
| Example 3 | Iridium 100% | Silver | Coating | Protective layer is present | 3.9 | A | 0.2 | 0 |
| Example 4 | Copper 100% | Silver | Coating | Protective layer is present | 3.9 | A | 0.2 | 0 |
| Example 5 | Platinum 100% | Silver | Coating | Protective layer is present | 4.1 | A | 0.2 | 0 |
| Example 6 | Osmium 100% | Silver | Coating | Protective layer is present | 4.1 | A | 0.2 | 0 |
| Example 7 | Silver 100% | Silver | Coating | Protective layer is present | 4.0 | A | 0.2 | 0 |
| Example 8 | Palladium 50%, Gold 50% | Silver | Coating | Protective layer is present | 4.0 | A | 0.2 | 0 |
| Example 9 | Palladium 50%, Platinum 50% | Silver | Coating | Protective layer is present | 4.0 | A | 0.2 | 0 |

TABLE 1-continued

| | Image receiving layer Metal ion of silver deposition nucleuses | Light shielding material | Layer forming method | Protective layer | Optical density | Heat application color change | Layer thickness (μm) | Air bubble (number) |
|---|---|---|---|---|---|---|---|---|
| Example 10 | Gold 50%, Platinum 50% | Silver | Coating | Protective layer is present | 3.9 | A | 0.2 | 0 |
| Example 11 | Palladium 40%, Platinum 30%, Gold 30% | Silver | Coating | Protective layer is present | 3.9 | A | 0.2 | 0 |
| Example 12 | Palladium 100% | Silver | Coating | Protective layer is present | 3.7 | A | 0.2 | 0 |
| Example 13 | Palladium 100% | Silver | Coating | Protective layer is absent | 4.0 | A | 0.2 | 0 |
| Example 14 | Gold 100% | Silver | Coating | Protective layer is absent | 3.8 | A | 0.2 | 0 |
| Example 15 | Iridium 100% | Silver | Coating | Protective layer is absent | 3.9 | A | 0.2 | 0 |
| Example 16 | Copper 100% | Silver | Coating | Protective layer is absent | 3.9 | A | 0.2 | 0 |
| Example 17 | Platinum 100% | Silver | Coating | Protective layer is absent | 4.1 | A | 0.2 | 0 |
| Example 18 | Osmium 100% | Silver | Coating | Protective layer is absent | 4.1 | A | 0.2 | 0 |
| Example 19 | Silver 100% | Silver | Coating | Protective layer is absent | 4.0 | A | 0.2 | 0 |
| Example 20 | Palladium 50%, Gold 50% | Silver | Coating | Protective layer is absent | 4.0 | A | 0.2 | 0 |
| Example 21 | Palladium 50%, Platinum 50% | Silver | Coating | Protective layer is absent | 4.0 | A | 0.2 | 0 |
| Example 22 | Gold 50%, Platinum 50% | Silver | Coating | Protective layer is absent | 3.9 | A | 0.2 | 0 |
| Example 23 | Palladium 40%, Platinum 30%, Gold 30% | Silver | Coating | Protective layer is absent | 3.9 | A | 0.2 | 0 |
| Example 24 | Palladium 100% | Silver | Coating | Protective layer is absent | 3.6 | A | 0.2 | 0 |

The results of Table 1 show that light shielding layers for a display device of the invention are high in optical densities and exhibit excellent light shielding properties although the thickness of the light shielding layer is small. The generation of air bubbles that are visually recognized during pixel formation was not observed, and so the light shielding layers are suitable for the formation of a color filter. Also, the fact that the light shielding layers rarely show the color changes after heat application and thus have high thermal stability suggests that the light shielding layers offer high durability even when they are used for liquid crystal elements.

Examples 25 to 36

1. Production of Transfer Materials

The thermoplastic resin layer coating solution of the composition mentioned below was applied to biaxially oriented polyethylene terephthalate supports having a thickness of 75 μm by means of a slide coater in such a way that the layer thickness became 15 μm, and the resulting supports were dried at 100° C. for five minutes. Then, the protective layer coating solution used in Example 1 was applied thereon so that a dried layer thickness became 1.5 μm, followed by drying at 100° C. for five minutes, whereby an intermediate layer was formed.

| Thermoplastic Resin Layer Coating Solution | |
|---|---|
| Copolymer of methylmethacrylate/2-ethylhexyl acrylate/benzylmethacrylate/methacrylic acid = 54/12/5/29 (number average molecular weight 80000) | 58 parts |
| Copolymer of styrene/acrylic acid = 70/30 (number average molecular weight 7000) | 136 parts |
| Multifunctional acrylate (BPE-500, manufactured by Shin-Nakamura Chemical Co., Ltd.) | 90 parts |
| Fluorine-based surfactant (F176PF manufactured by Dainippon Ink and Chemicals, Inc.) | 1 part |

| -continued | |
|---|---|
| Thermoplastic Resin Layer Coating Solution | |
| Methyl ethyl ketone | 541 parts |
| 1-Methoxy-2-propanol | 63 parts |
| Methyl alcohol | 111 parts |

Furthermore, on the intermediate layer formed on the supports, the same light-sensitive silver deposition nucleus layer coating solutions as used in Examples 1 to 12 were applied respectively and dried, whereby transfer materials were prepared.

2. Production of Light Shielding Layers for Display Device

Each transfer material obtained as described above and a glass substrate were laminated so that the image receiving layer was brought into intimate contact with the glass surface, and both were bonded together by a laminator, with the lamination conditions of a pressure of 0.8 kg/cm$^2$ and a temperature of 130° C.

Thereafter, the polyethylene terephthalate support was released, whereby a laminate was obtained that has the glass substrate to which the image receiving layer and the intermediate layer were transferred. The image receiving layer and intermediate layer formed surface of the laminates were exposed to light with surface energy of 70 mJ/cm$^2$ through a mask for the light shielding layer for a display device. Then, the resulting laminates were developed with the developers mentioned below one by one.

(1) Conditions subjected to developing treatment at 30° C. for 40 seconds with a developer TPD (alkaline developer manufactured by Fuji Photo Film Co., Ltd.).

(2) Conditions subjected to developing treatment at 33° C. for 20 seconds with a developer TCD (alkaline developer manufactured by Fuji Photo Film Co., Ltd.).

(3) Conditions subjected to developing treatment at 33° C. for 20 seconds with a developer TSD (alkaline developer manufactured by Fuji Photo Film Co., Ltd.).

After developing treatment, the laminates were rinsed with water and the water was removed with an air knife. Then, the resultant laminates were heated at 240° C. for 50 minutes, whereby silver deposition nucleus layer patterns containing a silver deposition nucleus were formed.

Thereafter, a silver halide emulsion layer was formed and immersing treatment with a silver complex treating solution was made in the same manner as in Example 1, thereby obtaining the substrates having a light shielding layer of Examples 25 to 36, which were evaluated as in Example 1. The results are shown in Table 2 below.

of water, and the final volume was made to 2000 ml by the addition of distilled water, and then the solution was kept at 40° C.

To Solution A were simultaneously added Solutions B and C with rapid agitation over 10 seconds. In 10 minutes, thereto was a solution prepared by dissolution of 1600 g sodium sulfate anhydride in 70 ml concentrated hydrochloric acid and in 8000 ml distilled water, and after 80-minute agitation, the resulting solution was precipitated and cooled. After the supernatant was removed, a Br salt solution was added to the solution until a precipitate did not appear, and the resulting

TABLE 2

| | Image receiving layer Metal ion of silver deposition nucleuses | Light shielding material | Layer forming method | Protective layer or intermediate layer | Optical density | Heat application color change | Layer thickness (μm) | Air bubble (number) |
|---|---|---|---|---|---|---|---|---|
| Example 25 | Palladium 100% | Silver | Transfer | Intermediate layer is present | 4.0 | A | 0.2 | 0 |
| Example 26 | Gold 100% | Silver | Transfer | Intermediate layer is present | 3.8 | A | 0.2 | 0 |
| Example 27 | Iridium 100% | Silver | Transfer | Intermediate layer is present | 3.9 | A | 0.2 | 0 |
| Example 28 | Copper 100% | Silver | Transfer | Intermediate layer is present | 3.9 | A | 0.2 | 0 |
| Example 29 | Platinum 100% | Silver | Transfer | Intermediate layer is present | 4.1 | A | 0.2 | 0 |
| Example 30 | Osmium 100% | Silver | Transfer | Intermediate layer is present | 4.1 | A | 0.2 | 0 |
| Example 31 | Silver 100% | Silver | Transfer | Intermediate layer is present | 4.0 | A | 0.2 | 0 |
| Example 32 | Palladium 50%, Gold 50% | Silver | Transfer | Intermediate layer is present | 4.0 | A | 0.2 | 0 |
| Example 33 | Palladium 50%, Platinum 50% | Silver | Transfer | Intermediate layer is present | 4.0 | A | 0.2 | 0 |
| Example 34 | Gold 50%, Platinum 50% | Silver | Transfer | Intermediate layer is present | 3.9 | A | 0.2 | 0 |
| Example 35 | Palladium 40%, Platinum 30%, Gold 30% | Silver | Transfer | Intermediate layer is present | 3.9 | A | 0.2 | 0 |
| Example 36 | Palladium 100% | Silver | Transfer | Intermediate layer is present | 3.8 | A | 0.2 | 0 |
| Comparative Example 1 | — | Silver | Coating | Protective layer is present | 4.0 | E | 0.1 | 0 |
| Comparative Example 2 | — | Silver | Transfer | Intermediate layer is present | 4.0 | E | 0.11 | 0 |
| Comparative Example 3 | — | Carbon + pigment | Coating | Protective layer is present | 4.0 | A | 2.35 | Not less than 50 |
| Comparative Example 4 | — | Carbon + pigment | Transfer | Intermediate layer is present | 4.0 | A | 2.35 | Not less than 50 |

Comparative Example 1

1. Preparation of Silver Fine Particles

Preparation of Solution A

To 50 g of deashed gelatin was added 1950 g of distilled water and the resulting mixture was heated to about 40° C. to dissolve the gelatin. The resulting solution was adjusted to pH 9.2 with a 5% aqueous NaOH solution, and the solution was kept at 40° C.

Preparation of Solution B

To 150 g of deashed gelatin was added 1350 g of distilled water and the resulting mixture was heated to about 40° C. to dissolve the gelatin. The resulting solution was adjusted to pH 9.2 with a 5% aqueous NaOH solution. Therein were dissolved 16.0 g of calcium acetate and 160 g of silver nitrate dissolved in 320 ml of distilled water with agitation, and the final volume was made to 2000 ml by the addition of distilled water, and then the solution was kept at 40° C.

Preparation of Solution C 110 g of sodium sulfite (anhydride) was dissolved in 700 ml of distilled water, and therewith was mixed a solution of 80 g of hydroquinone dissolved in 70 ml of methanol and 80 ml precipitate was immediately rinsed with distilled water. After the water removal, the precipitate was dissolved again. Thereafter, the product (solution prepared by re-dissolution) was cooled near to the gelation temperature, and the resulting gel was passed through small holes and then entered into water, whereby a very fine noodle-like product was formed.

The product was washed with a solution prepared by dissolution of 20 g sodium sulfite (anhydride) and 0.6 g NaOH in 2000 ml distilled water and additionally washed with a solution of 20 g glacial acetic acid in 2000 ml distilled water. The resultant black slurry particles allowed tap water to pass therethrough in a nylon mesh bag via slurry. The washing water was made to pass through the bag for about 30 minutes for washing, and all the salts was made to be washed away.

The washed black silver dispersed in the gel slurry was dissolved in water and the water of the product was adjusted so that the product became black silver dispersions having a silver concentration of 1.5% by mass.

Preparation of Silver Fine Particles

To 5000 g of the silver dispersion slurry obtained as described above were added 25 g of a dispersant (RAPISOL B-90 manufactured by NOF Corp.) and 1000 g of a 5% by mass aqueous papain solution and the resulting solution was maintained 37° C. for 24 hours. The solution was centrifuged at 2000 rpm for five minutes to precipitate silver fine particles. After removal of the supernatant, the solution was washed with distilled water to thereby remove the gelatin decomposed material decomposed by an enzyme. Then, the silver fine particle precipitate was methyl alcohol washed and dried. About 85 g of agglomerate of silver fine particles was obtained. 73.5 g of the agglomerate was blended with 1.05 g of SOLSPERSE (dispersant manufactured by Avecia K.K.) and 16.4 g of methyl ethyl ketone. The solution was dispersed by a bead dispersing machine (zirconia bead 0.3 mm), whereby silver fine particle dispersion solution A-1 having an average particle size of 30 nm was obtained.

2. Preparation of Coating Solution for Light-Sensitive Layer

To silver fine particle dispersion solution A-1 obtained as described above the additive below to prepare a coating solution for a light-sensitive layer.

| Coating solution for a Light-Sensitive Layer | |
|---|---|
| Silver fine particle dispersion solution A-1 | 40.0 g |
| Propylene glycol monomethyl ether acetate | 40.0 g |
| Methyl ethyl ketone | 37.6 g |
| Fluorine-based surfactant | 0.2 g |
| (F176PF (20%) manufactured by | |
| Dainippon Ink and Chemicals, Inc.) | |
| Hydroquinone monomethyl ether | 0.001 g |
| Dipentaerythritol hexaacrylate | |
| (added so that the volume fraction of | |
| the silver fine particles in the light | |
| sensitive layer becomes 0.126) | |
| Bis(4-(N-(4-(4,6-bistrichloromethyl-s-triazine-2-yl)phenyl)carbamoyl)phenyl)sebacate | 0.1 g |

3. Preparation of Protective Layer Coating Solution

A protective layer coating solution as used in Example 1 was prepared.

4. Production of Light-Sensitive Material

The protective layer coating solution was applied to a glass substrate by means of a spin coater in such a way that the optical density became 4.0, and the resulting substrate was dried at 100° C. for five minutes. Then, thereon was applied the protective layer coating solution so that a dried layer thickness became 1.5 μm, and the resulting substrate was dried at 100° C. for five minutes.

5. Production of Light Shielding Layer for Display Device

The applied surface of the substrate was exposed to light with surface energy of 70 mJ/cm² by means of an ultra-high pressure mercury lamp through a photomask for a light shielding layer for a display device. Then, developing treatment was carried out under the conditions mentioned below one by one to obtain a light shielding layer for a display device.

(1) Conditions subjected to developing treatment at 33° C. for 20 seconds with a developer TCD (alkaline developer manufactured by Fuji Photo Film Co., Ltd.).

(2) Conditions subjected to developing treatment at 33° C. for 20 seconds with a developer TSD (alkaline developer manufactured by Fuji Photo Film Co., Ltd.).

Evaluation of a Light Shielding Layer for a Display Device

The light shielding layer for a display device was evaluated as in Example 1. The result is indicated in Table 2. In particular, the result of change of the light shielding layers for a display device prior to and subsequent to heat treatment was level E, which shows clear metal brightness, on the basis of the evaluation criteria, resulting in no practical use.

The result of layer thickness determination is 0.11 μm.

Comparative Example 2

1. Production of Light-Sensitive Transfer Material

A thermoplastic resin layer coating solution similar to that used in Example 23 was applied to a biaxial oriented polyethylene terephthalate support having a thickness of 75 μm by means of a slide coater in such a way that the layer thickness became 15 μm, and the resulting support was dried at 100° C. for five minutes. Then, the same intermediate layer coating solution used in Example 25 was applied so that a dried layer thickness became 1.5 μm, and the resulting support was dried at 100° C. for five minutes. Also, a coating solution for a light-sensitive layer similar to that used in Comparative Example 1 was applied thereto and dried, whereby a light-sensitive transfer material was produced.

2. Production of Light Shielding Layer for Display Device

The light-sensitive transfer material and a glass substrate were laminated so that the image receiving layer was brought into intimate contact with the glass surface, and both were bonded together by the laminator as used in Example 25, with the lamination conditions of a pressure of 0.8 kg/cm² and a temperature of 130° C.

Thereafter, the polyethylene terephthalate support was released. The applying surface of the layer was exposed to light with surface energy of 70 mJ/cm² by means of an ultra-high pressure mercury lamp through a photomask for a light shielding layer for a display device. Then, the resulting layer was developed under the conditions mentioned below one by one and rinsed, and the resulting layer was water removed with an air knife to obtain a light shielding layer for a display device.

(1) Conditions subjected to developing treatment at 30° C. for 40 seconds with a developer TPD (alkaline developer manufactured by Fuji Photo Film Co., Ltd.).

(2) Conditions subjected to developing treatment at 33° C. for 20 seconds with a developer TCD (alkaline developer manufactured by Fuji Photo Film Co., Ltd.).

(3) Conditions subjected to developing treatment at 33° C. for 20 seconds with a developer TSD (alkaline developer manufactured by Fuji Photo Film Co., Ltd.).

Evaluation of Light Shielding Layer for Display Device

The light shield layer for a display device was evaluated as in Example 1. The result is indicated in Table 2. In particular, the result of change of the light shielding layers for a display device prior to and subsequent to heat treatment was level E, which shows clear metal brightness, on the basis of the evaluation criteria, resulting in no practical use.

The result of layer thickness determination is 0.11 μm.

Comparative Example 3

1. Preparation of Resist Coating Solution

A black resist coating solution indicated below was applied to a glass substrate so that the optical density (OD) became 4.0, and the resulting substrate was dried at 100° C. for five minutes. Thereon was applied a protective layer coating solution so that a dried layer thickness became 1.5 μm, and the resulting support was dried at 100° C. for five minutes. The protective layer coating solution used in Examples 1 was used as the intermediate layer coating solution.

Black resist coating solution:

| | |
|---|---|
| CFP-FF-775B (C. I. PB15: 6 fluid dispersion manufactured by Fujifilm Olin Co., Ltd.) | 4.50 parts |
| CFP-FF-293Y (C. I. PY139 fluid dispersion manufactured by Fujifilm Olin Co., Ltd.) | 3.37 parts |
| CFP-FF-802V (C. I. PV23 fluid dispersion manufactured by Fujifilm Olin Co., Ltd.) | 4.16 parts |
| CFP-FF-949K (carbon black fluid dispersion manufactured by Fujifilm Olin Co., Ltd.) | 11.9 parts |
| MMPG-AD (propylene glycol monomethyl ether acetate) | 18.9 parts |
| Methyl ethyl ketone | 52.0 parts |
| Hydroquinone monomethyl ether | 0.0022 parts |
| Dipentaerythritol hexaacrylate | 4.85 parts |
| Bis(4-(N-(4-(4,6-bistrichloromethyl-s-triazine-2-yl)phenyl) carbamoyl)phenyl)sebacate | 0.238 parts |
| Copolymer below (30% by mass methyl isobutyl ketone solution) | 0.065 parts |

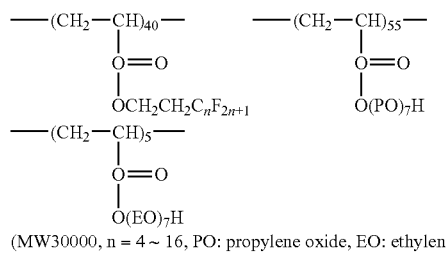

(MW30000, n = 4 ~ 16, PO: propylene oxide, EO: ethylene oxide)

2. Production of Light Shielding Layers for Display Device

The applying surface of the light-sensitive material to which the coating solution for the black resist was exposed to light with surface energy of 70 mJ/cm² by means of an ultra high-pressure mercury lamp through a photomask for a light shielding layer for a display device. Then, the resulting layer was developed under the conditions mentioned below one by one and rinsed with water, and the resulting layer was water removed with an air knife to obtain a light shielding layer for a display device.
(1) Conditions subjected to developing treatment at 33° C. for 20 seconds with a developer TCD (alkaline developer manufactured by Fuji Photo Film Co., Ltd.).
(2) Conditions subjected to developing treatment at 33° C. for 20 seconds with a developer TSD (alkaline developer manufactured by Fuji Photo Film Co., Ltd.).

Evaluation of Light Shielding Layer for Display Device

The light shielding layer for a display device was evaluated as in Example 1. The result is indicated in Table 2. The result of the layer thickness determination was 2.35 µm. Because the layer was such a thick light shielding layer, the number of air bubbles visually observed in "Evaluation of the Formation of Blue, Red and Green Pixels and Air Bubbles of Pixels" was more than 50, resulting in no practically usable material as a color filter.

Comparative Example 4

1. Production of Light-Sensitive Transfer Material

A thermoplastic resin layer coating solution similar to that used in Example 23 was applied to a biaxially oriented polyethylene terephthalate support having a thickness of 75 µm by means of a slide coater in such a way that the layer thickness became 15 µm, and the resulting support was dried at 100° C. for five minutes. Then, the same intermediate layer coating solution used in Example 25 was applied thereon so that a dried layer thickness became 1.5 µm, and the resulting support was dried at 100° C. for five minutes. Also, a coating solution for a black resist similar to that used in Comparative Example 3 was applied thereto and dried, whereby a light-sensitive transfer material was produced.

2. Production of Light Shielding Layer for Display Device

The light-sensitive transfer material and a glass substrate were laminated so that the image receiving layer was brought into intimate contact with the glass surface, and both were bonded together by the laminator as used in Example 25, with the lamination conditions of a pressure of 0.8 kg/cm² and a temperature of 130° C.

Thereafter, the polyethylene terephthalate support was released. The applying surface of the layer was exposed to light with surface energy of 70 mJ/cm² by means of an ultra-high pressure mercury lamp through a photomask for a light shielding layer for a display device. Then, the resulting layer was developed under the conditions mentioned below one by one and rinsed with water, and the resulting layer was water removed with an air knife to obtain a light shielding layer for a display device.
(1) Conditions subjected to developing treatment at 30° C. for 40 seconds with a developer TPD (alkaline developer manufactured by Fuji Photo Film Co., Ltd.).
(2) Conditions subjected to developing treatment at 33° C. for 20 seconds with a developer TCD (alkaline developer manufactured by Fuji Photo Film Co., Ltd.).
(3) Conditions subjected to developing treatment at 33° C. for 20 seconds with a developer TSD (alkaline developer manufactured by Fuji Photo Film Co., Ltd.).

Evaluation of Light Shielding Layer for Display Device

The light shielding layer for a display device was evaluated as in Example 1. The result is indicated in Table 2. The result of the layer thickness determination was 2.35 µm. Because the layer was such a thick light shielding layer, the number of air bubbles visually observed in "Evaluation of the Formation of Blue, Red and Green Pixels and Air Bubbles of Pixels" was more than 50, resulting in no practically usable material as a color filter.

The evaluation results of Examples 1 to 36 and Comparative Examples 1 to 4 show that the light shielding layers for display devices produced by use of light-sensitive compositions of the invention, even though they are formed by the applying method or are formed by the transferring method, have high optical density although they are thin and exhibit no color changes after heat application, and that the light shielding layers of the invention can suitably used for optical elements and color filters since the generation of air bubbles are restrained when the pixels are formed and then the color filters are formed.

On the other hand, although the light shielding layers of Comparative Examples 1 and 2, which have light shielding layers in which conventional silver fine particles are dispersed, are excellent in light shielding properties, they are practically unsuitable as light shielding layers for display devices because the changes of the brightness are extreme subsequent to heat application. In addition, the light shielding layers for display devices of Comparative Examples 3 and 4, which are produced by use of a coating solution for a black resist, show that the light shielding layer are thick and extremely produce air bubbles when the pixels are formed and are unsuited to light shielding layers for display devices for color filters.

A light-sensitive composition of the invention enables a light shielding layer for a display device, which is thin, and high in light shielding performance to be produced at low cost. Also, the light-sensitive composition can provide a light-sensitive transferring material that uses the light-sensitive composition.

A light shielding layer for a display device of the invention, which is obtained with a light-sensitive composition of the invention, is thin and has an effect of being high in light shielding performance. The method of producing a substrate having a light shielding layer for a display device of the invention can readily produce a substrate having such a light shielding layer for a display device at low cost.

By disposing a light shielding layer for a display device of the invention, which is thin and exhibits high light shielding performance, a color filter and liquid crystal display element having excellent characteristics, and moreover a substrate having a light shielding layer for a display device which is thin and high in light shielding performance can be provided.

What is claimed is:

1. A light-sensitive composition comprising silver deposition nuclei and an alkali-soluble binder, wherein the content of the alkali-soluble binder is in a range of from 20 to 80% by mass based on total solid components.

2. A light-sensitive composition according to claim 1, wherein the silver deposition nuclei comprises a sulfide.

3. A light shielding layer for a display device,
   wherein a light-sensitive silver deposition nuclei containing layer formed on a substrate by means of the light-sensitive composition of claim 1 is subjected to exposure and developing treatment, followed by silver deposition.

4. A color filter comprising a colored layer on a light transmitting substrate and comprising two or more pixel groups that exhibit colors different from each other,
   wherein each pixel constituting the pixel groups is separated from each other by a light shielding layer for a display device, and
   wherein the light shielding layer for a display device is the light shielding layer for a display device of claim 3.

5. A liquid crystal display element comprising a color filter, a liquid crystal layer and a liquid crystal driver between a pair of substrates, at least one of the substrates having light transmitting properties,
   wherein the color filter is the color filter of claim 4.

6. A liquid crystal display element comprising a color filter, a liquid crystal layer and a liquid crystal driver between a pair of substrates, at least one of the substrates having light transmitting properties,
   wherein the liquid crystal driver has active elements, and
   wherein the light shielding layer for a display device of claim 3 is formed between the active elements.

7. A substrate having a light shielding layer for a display device comprising a light shielding layer on a light transmitting substrate,
   wherein the light shielding layer is the light shielding layer for a display device of claim 3.

8. The light shielding layer for a display device of claim 3, wherein the light-sensitive composition is subject to heat treatment after developing treatment, followed by silver deposition.

9. A light shielding layer for a display device,
   wherein a light-sensitive silver deposition nuclei containing layer formed on a substrate by means of the light-sensitive composition of claim 1 is subjected to silver deposition, followed by exposure and developing treatment.

10. The light-sensitive composition of claim 1, wherein the alkali-soluble binder comprises at least one component selected from the group consisting of (1) copolymers of (meth)acrylic acid and (meth)acrylic acid esters, (2) styrene/maleic anhydride copolymers, and (3) reaction products of the copolymers and alcohols.

11. The light-sensitive composition of claim 1, wherein the silver deposition nuclei comprise at least one nuclei type selected from the group consisting of palladium sulfide and gold sulfide.

12. A light-sensitive composition comprising silver deposition nuclei, a photopolymerization initiator, a photopolymerizable monomer, and an alkali-soluble binder, wherein the content of the alkali-soluble binder is in a range of from 20 to 80% by mass based on total solid components.

13. A light-sensitive transfer material comprising a support provided with at least a light-sensitive silver deposition nuclei containing layer,
   wherein the light-sensitive silver deposition nuclei containing layer comprises silver deposition nuclei, a photopolymerization initiator, a photopolymerizable monomer, and an alkali-soluble binder, wherein the content of the alkali-soluble binder is in a range of from 20 to 80% by mass based on total solid components.

* * * * *